(12) United States Patent
Tanemura

(10) Patent No.: US 7,781,901 B2
(45) Date of Patent: Aug. 24, 2010

(54) SEMICONDUCTOR DEVICE AND PROCESSING METHOD OF THE SAME

(75) Inventor: Yukihiro Tanemura, Chitose (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 146 days.

(21) Appl. No.: 11/839,078

(22) Filed: Aug. 15, 2007

(65) Prior Publication Data

US 2008/0251950 A1   Oct. 16, 2008

(30) Foreign Application Priority Data

Sep. 5, 2006 (JP) ............... 2006-240324

(51) Int. Cl.
*H01L 23/544* (2006.01)
*H01L 21/46* (2006.01)
(52) U.S. Cl. ................... 257/797; 438/462
(58) Field of Classification Search ........... 257/797; 438/462
See application file for complete search history.

(56) References Cited

U.S. PATENT DOCUMENTS

| | | | |
|---|---|---|---|
| 6,441,504 B1 * | 8/2002 | Glenn et al. | 257/797 |
| 6,716,679 B2 | 4/2004 | Bae | |
| 6,815,838 B2 * | 11/2004 | Daubenspeck et al. | 257/797 |
| 7,053,495 B2 * | 5/2006 | Tsuura | 257/797 |
| 7,205,637 B2 * | 4/2007 | Koike | 257/620 |
| 7,456,083 B2 | 11/2008 | Noma et al. | |
| 2005/0208735 A1 * | 9/2005 | Noma et al. | 438/460 |
| 2007/0187763 A1 * | 8/2007 | Agari et al. | 257/360 |

FOREIGN PATENT DOCUMENTS

| | | |
|---|---|---|
| JP | 2000-323576 | 11/2000 |
| KR | 20030073378 A | 9/2003 |
| KR | 20060043788 A | 5/2006 |

\* cited by examiner

*Primary Examiner*—Fernando L Toledo
(74) *Attorney, Agent, or Firm*—Ladas & Parry LLP

(57) ABSTRACT

A disclosed semiconductor device includes a semiconductor substrate including semiconductor integrated circuit forming areas; semiconductor integrated circuits formed on the semiconductor integrated circuit forming areas; and an alignment pattern formed on a periphery of at least one of the semiconductor integrated circuit forming areas.

6 Claims, 12 Drawing Sheets

SEMICONDUCTOR DEVICE AND PROCESSING METHOD OF THE SAME

BACKGROUND OF THE INVENTION

1. Field of the Invention

The present invention generally relates to a semiconductor device and a method of processing the semiconductor device. More particularly, this invention relates to a semiconductor device including an alignment pattern and a method of processing the semiconductor device.

2. Description of the Related Art

Normally, multiple alignment patterns are provided on a wafer that is to be diced into chips (hereafter, a wafer where multiple semiconductor integrated circuits are formed is called a semiconductor device). Such alignment patterns are used by a semiconductor manufacturing apparatus, such as an exposure apparatus or a laser trimming apparatus, to align a semiconductor device. A semiconductor manufacturing apparatus detects an alignment pattern on a semiconductor device using an image recognition device and a camera and aligns the semiconductor device based on the detected alignment pattern. In this process, if the contrast of the alignment pattern is low, it is difficult to accurately align the semiconductor device.

FIG. 11 is a plan view of a portion of a conventional semiconductor device 100. The portion corresponds to the imaging area of an image recognition camera of a laser trimming apparatus (not shown).

As shown in FIG. 11, the semiconductor device 100 includes a semiconductor substrate 101, semiconductor integrated circuits 102, and an alignment pattern 103. The semiconductor substrate 101 includes semiconductor integrated circuit forming areas E and a scribe area F that separates the semiconductor integrated circuit forming areas E from each other. The semiconductor integrated circuits 102 are formed on the semiconductor integrated circuit forming areas E of the semiconductor substrate 101.

The alignment pattern 103 is provided for each portion of the semiconductor device 100 which portion corresponds to the imaging area of the image recognition camera of the laser trimming apparatus and is formed to cover almost the entire area of one of the semiconductor integrated circuit forming areas E in the portion. In other words, multiple alignment patterns 103 are provided on the semiconductor substrate 101. As the alignment pattern 103, for example, a test element group (TEG) pattern, which has high contrast, may be used.

One disadvantage of the semiconductor device 100 is that since each alignment pattern 103 occupies one semiconductor integrated circuit forming area E, the number of semiconductor integrated circuits 102 that can be formed on one semiconductor substrate 101 is reduced.

FIG. 12 is a plan view of a portion of another conventional semiconductor device 110 that has been proposed to solve the above problem. The portion corresponds to the imaging area of an image recognition camera of a laser trimming apparatus (not shown).

In FIG. 12, the same reference numbers are used for the components corresponding to those of the semiconductor device 100 shown in FIG. 11.

As shown in FIG. 12, the semiconductor device 110 includes a semiconductor substrate 101, semiconductor integrated circuits 102, and an alignment pattern 111. The alignment pattern 111 is provided for each portion of the semiconductor device 110 which portion corresponds to the imaging area of the image recognition camera of the laser trimming apparatus and is formed on a part of a scribe area F. As the material of the alignment pattern 111, for example, aluminum (Al) may be used (see, for example, patent document 1). As is clear from FIG. 12, this configuration improves the efficiency of use of space.

[Patent Document 1] Japanese Patent Application Publication No. 2000-323576

However, when the size of the semiconductor integrated circuits 102 of the semiconductor device 110 becomes small, the width W5 of the scribe area F becomes small and, accordingly, the width W6 of the alignment pattern 111 becomes small. If the alignment pattern 111 becomes very thin, the intensity of light reflected from the alignment pattern 111 becomes low and, as a result, it becomes difficult to detect the position of the alignment pattern 111.

SUMMARY OF THE INVENTION

Embodiments of the present invention provide a semiconductor device and a method of processing the semiconductor device that solve or reduce one or more problems caused by the limitations and disadvantages of the related art.

An embodiment of the present invention provides a semiconductor device that includes a semiconductor substrate including semiconductor integrated circuit forming areas; semiconductor integrated circuits formed on the semiconductor integrated circuit forming areas; and an alignment pattern formed on a periphery of at least one of the semiconductor integrated circuit forming areas.

Another embodiment of the present invention provides a method of processing a semiconductor device comprising a semiconductor substrate including semiconductor integrated circuit forming areas and semiconductor integrated circuits formed on the semiconductor integrated circuit forming areas, each of the semiconductor integrated circuits including a fuse pattern for adjusting its electrical characteristic. The method includes an alignment step of aligning the semiconductor device by a laser trimming apparatus based on an alignment pattern formed on a periphery of at least one of the semiconductor integrated circuit forming areas; and a fuse pattern cutting step of cutting, by the laser trimming apparatus, the fuse pattern of at least one of the semiconductor integrated circuits whose electrical characteristic needs to be adjusted.

DESCRIPTION OF THE PREFERRED EMBODIMENTS

Preferred embodiments of the present invention are described below with reference to the accompanying drawings.

First Embodiment

Figure 1:
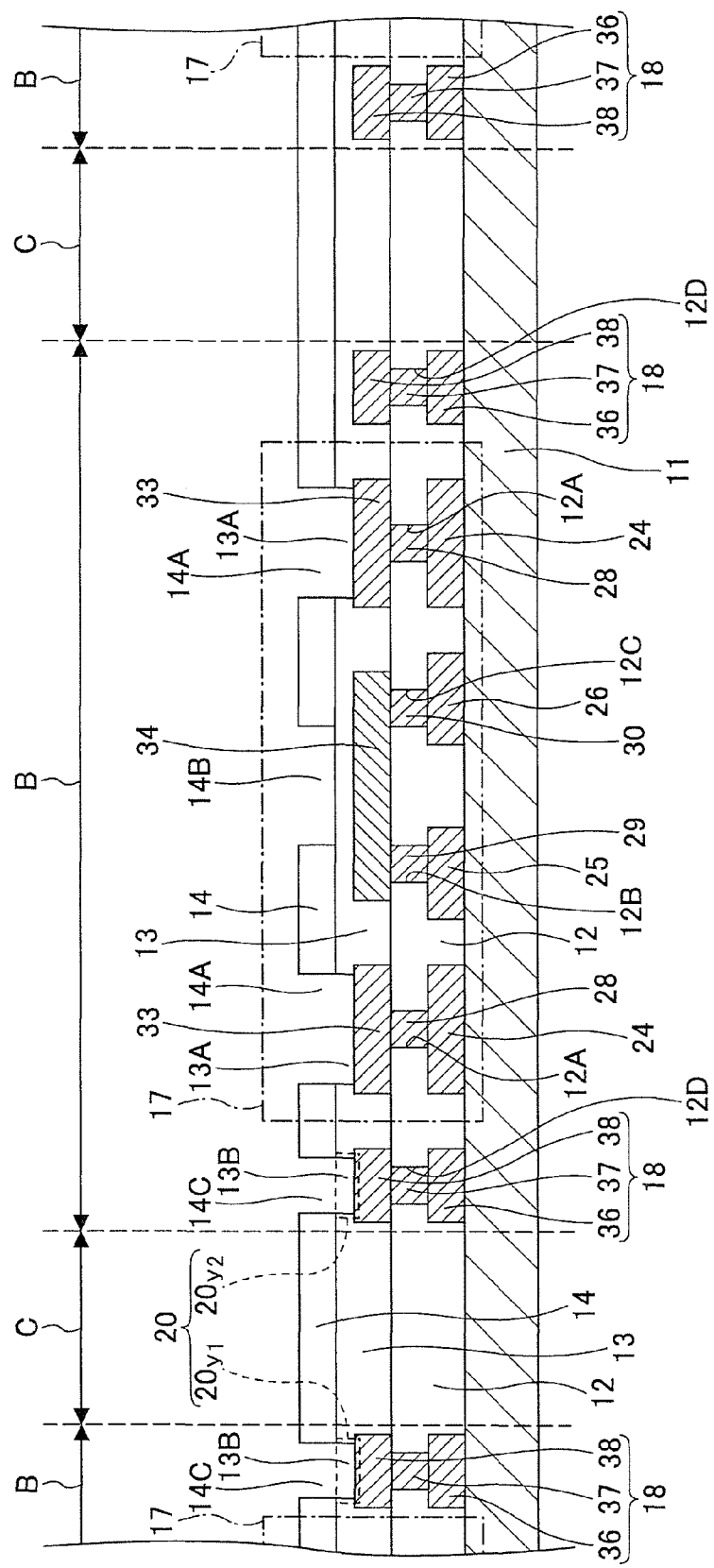
FIG. 1 is a cut-away side view of a semiconductor device according to a first embodiment of the present invention.

FIG. 1 is a cut-away side view of a semiconductor device according to a first embodiment of the present invention.

As shown in FIG. 1, a semiconductor device 10 of the first embodiment includes a semiconductor substrate 11, insulating films 12 and 13, a passivation film 14, semiconductor integrated circuits 17, guard rings 18, alignment patterns 20 used to roughly align the semiconductor device 10, and chip alignment patterns (not shown).

The semiconductor substrate 11 is divided into multiple semiconductor integrated circuit forming areas B by a scribe area C. On each of the semiconductor integrated circuit forming areas B, the semiconductor integrated circuit 17 and the guard ring 18 are formed. The semiconductor integrated circuit forming area B is shaped like a quadrangle having two sides D1 (first sides) and two sides D2 (second sides) that are orthogonal to the sides D1 (see FIG. 2). The length of the sides D1 and D2 is, for example, 4 mm.

The semiconductor substrate 11 is to be diced into the semiconductor integrated circuit forming areas B by a dicer along the scribe area C. As the semiconductor substrate 11, for example, an Si wafer may be used.

The insulating film 12 is formed to cover areas of the semiconductor substrate 11 corresponding to the semiconductor integrated circuit forming areas B and the scribe area C. As the insulating film 12, for example, an $SiO_2$ film may be used. The insulating film 13 is formed on the insulating film 12. As the insulating film 13, for example, a P—SiN film may be used.

The passivation film 14 is formed on the insulating film 13. As the passivation film 14, for example, a polyimide film may be used.

The semiconductor integrated circuits 17 are formed on the semiconductor integrated circuit forming areas B of the semiconductor substrate 11. Each of the semiconductor integrated circuits 17 includes wiring patterns 24 through 26, the insulating film 12, vias 28 through 30, bonding pads 33, a fuse pattern 34, the insulating film 13, and the passivation film 14.

The wiring patterns 24 are formed on the semiconductor substrate 11 at positions closer to the center of the semiconductor integrated circuit forming area B than the guard ring 18. The wiring patterns 25 and 26 are formed on the semiconductor substrate 11 at positions closer to the center of the semiconductor integrated circuit forming area B than the wiring patterns 24. As the material of the wiring patterns 24 through 26, for example, an Al alloy may be used.

The insulating film 12 is formed on the semiconductor substrate 11 so as to cover the wiring patterns 24 through 26. The insulating film 12 has openings 12A exposing the upper surfaces of the wiring patterns 24, an opening 12B exposing the upper surface of the wiring pattern 25, and an opening 12C exposing the upper surface of the wiring pattern 26.

The vias 28 are formed through the openings 12A. The lower ends of the vias 28 are connected to the wiring patterns 24 and the upper ends of the vias 28 are connected to the bonding pads 33. The via 29 is formed through the opening 12B. The lower end of the via 29 is connected to the wiring pattern 25 and the upper end of the via 29 is connected to the fuse pattern 34.

The via 30 is formed through the opening 12C. The lower end of the via 30 is connected to the wiring pattern 26 and the upper end of the via 30 is connected to the fuse pattern 34. As the material of the vias 28 through 30, for example, tungsten may be used.

The bonding pads 33 are formed on the insulating film 12. The upper surfaces of the bonding pads 33 are exposed through the insulating film 13 and the passivation film 14. The bonding pads 33 function as external terminals of the semiconductor integrated circuit 17. As the material of the bonding pads 33, for example, an Al alloy may be used.

The fuse pattern 34 is formed on the insulating film 12. The fuse pattern 34 electrically connects the wiring patterns 25 and 26. The fuse pattern 34 is used to adjust electrical characteristics (for example, the resistance) of the semiconductor integrated circuit 17. For example, when one of the semiconductor integrated circuits 17 has a resistance higher than a predetermined value, the fuse pattern 34 of that semiconductor integrated circuit 17 is cut by a laser trimming apparatus using a laser beam. Cutting the fuse pattern 34 or cutting the electric connection between the wiring patterns 25 and 26 reduces the resistance of the semiconductor integrated circuit 17. As another example, when the semiconductor integrated circuit 17 is a memory, it is possible to switch a malfunctioning circuit containing defective bits to a spare circuit by cutting the fuse pattern 34. As the material of the fuse pattern 34, for example, a polysilicon film or a metal film (such as an Al alloy film) may be used.

The insulating film 13 is formed on the insulating film 12 and covers the fuse pattern 34. The insulating film 13 has openings 13A exposing the upper surfaces of the bonding pads 33.

The passivation film 14 is formed on the insulating film 13. The passivation film 14 has openings 14A connected to the openings 13A and an opening 14B exposing a portion of the insulating film 13 above the fuse pattern 34. The opening 14B allows a laser beam from a laser trimming apparatus to pass through to cut the fuse pattern 34.

Figure 2:
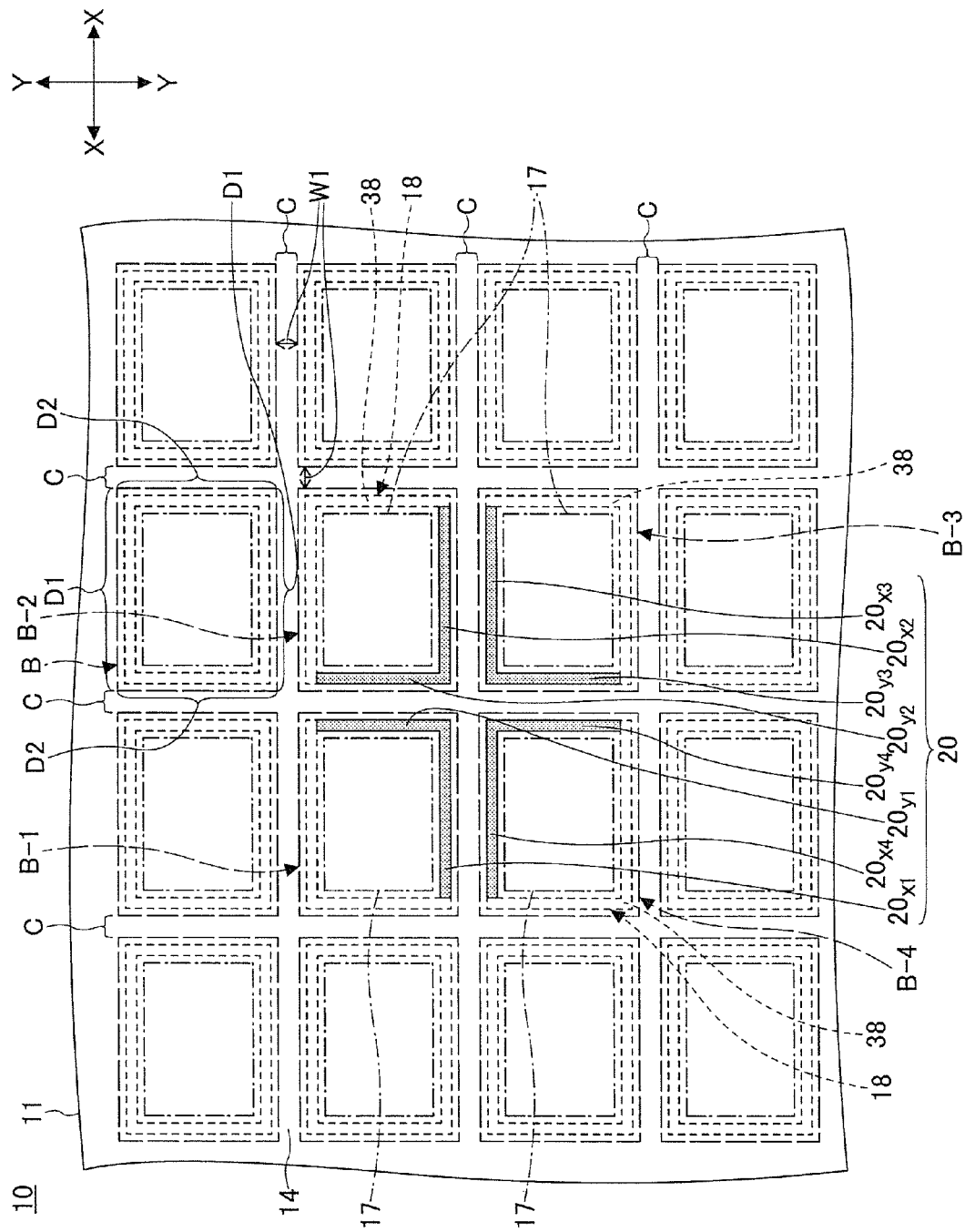
FIG. 2 is a plan view of a semiconductor device according to the first embodiment of the present invention.

FIG. 2 is a plan view of a portion of the semiconductor device 10 of the first embodiment. The portion corresponds to the imaging area of an image recognition camera of a laser trimming apparatus (not shown). In FIG. 2, the X-X directions are substantially parallel to the sides D1 (first sides) of the semiconductor integrated circuit forming area B and the Y-Y directions are substantially parallel to the sides D2 (second sides) of the semiconductor integrated circuit forming area B. For descriptive purposes, four semiconductor integrated circuit forming areas B in the center of FIG. 2 are called B-1 through B-4, respectively. In this embodiment, the alignment pattern 20 is formed on the semiconductor integrated circuit forming areas B-1 through B-4.

As shown in FIGS. 1 and 2, the guard ring 18 is formed on the periphery of the semiconductor integrated circuit forming area B of the semiconductor substrate 11. In other words, the guard ring 18 is formed so as to surround the semiconductor integrated circuit 17.

The guard ring 18 includes wiring patterns 36 and 38 and a via 37. The wiring pattern 36 is shaped like a frame and is formed on the semiconductor substrate 11 so as to surround the semiconductor integrated circuit 17. A portion of the wiring pattern 36 is exposed through an opening 12D formed in the insulating film 12. The via 37 is formed through the opening 12D. The lower end of the via 37 is connected to the wiring pattern 36 and the upper end of the via 37 is connected to the wiring pattern 38. The wiring pattern 38 is formed on the insulating film 12 in a position corresponding to the via 37. The width of the wiring pattern 38 is, for example, 20 µm.

The guard ring 18 surrounding the semiconductor integrated circuit 17 prevents moisture and corrosive gases from entering the semiconductor integrated circuit 17.

As shown in FIG. 2, the alignment pattern 20 includes first patterns $20_{x1}$ through $20_{x4}$ and second patterns $20_{y1}$ through $20_{y4}$. The first patterns $20_{x1}$ through $20_{x4}$ are shaped like strips that are substantially parallel to the sides D1 of the corresponding semiconductor integrated circuit forming areas B-1 through B-4.

The first pattern $20_{x1}$ is composed of a portion of the wiring pattern 38 (of the guard ring 18) formed on the semiconductor integrated circuit forming area B-1 which portion faces the side D1 of the semiconductor integrated circuit forming area B-4 and is exposed through the insulating film 13 and the passivation film 14. The first pattern $20_{x2}$ is composed of a portion of the wiring pattern 38 (of the guard ring 18) formed on the semiconductor integrated circuit forming area B-2 which portion faces the side D1 of the semiconductor integrated circuit forming area B-3 and is exposed through the insulating film 13 and the passivation film 14.

The first pattern $20_{x3}$ is composed of a portion of the wiring pattern 38 (of the guard ring 18) formed on the semiconductor integrated circuit forming area B-3 which portion faces the side D1 of the semiconductor integrated circuit forming area B-2 and is exposed through the insulating film 13 and the passivation film 14. The first pattern $20_{x4}$ is composed of a portion of the wiring pattern 38 (of the guard ring 18) formed on the semiconductor integrated circuit forming area B-4 which portion faces the side D1 of the semiconductor integrated circuit forming area B-1 and is exposed through the insulating film 13 and the passivation film 14.

The second patterns $20_{y1}$ through $20_{y4}$ are shaped like strips that are substantially parallel to the sides D2 of the corresponding semiconductor integrated circuit forming areas B-1 through B-4. The second patterns $20_{y1}$ through $20_{y4}$ form substantially right angles with the corresponding first patterns $20_{x1}$ through $20_{x4}$.

The second pattern $20_{y1}$ is composed of a portion of the wiring pattern 38 (of the guard ring 18) formed on the semiconductor integrated circuit forming area B-1 which portion faces the side D2 of the semiconductor integrated circuit forming area B-2 and is exposed through the insulating film 13 and the passivation film 14. The second pattern $20_{y2}$ is composed of a portion of the wiring pattern 38 (of the guard ring 18) formed on the semiconductor integrated circuit forming area B-2 which portion faces the side D2 of the semiconductor integrated circuit forming area B-1 and is exposed through the insulating film 13 and the passivation film 14.

The second pattern $20_{y3}$ is composed of a portion of the wiring pattern 38 (of the guard ring 18) formed on the semiconductor integrated circuit forming area B-3 which portion faces the side D2 of the semiconductor integrated circuit forming area B-4 and is exposed through the insulating film 13 and the passivation film 14. The second pattern $20_{y4}$ is composed of a portion of the wiring pattern 38 (of the guard ring 18) formed on the semiconductor integrated circuit forming area B-4 which portion faces the side D2 of the semiconductor integrated circuit forming area B-3 and is exposed through the insulating film 13 and the passivation film 14.

In other words, the first patterns $20_{x1}$ through $20_{x4}$ and the second patterns $20_{y1}$ through $20_{y4}$ are exposed through openings 13B of the insulating film 13 and openings 14C of the passivation film 14. With this configuration, light is reflected from the upper surfaces of the first patterns $20_{x1}$ through $20_{x4}$ and the second patterns $20_{y1}$ through $20_{y4}$ to the image recognition camera of the laser trimming apparatus placed above the semiconductor device 10.

Multiple alignment patterns 20 are provided on the semiconductor substrate 11. For example, the alignment pattern 20 may be provided for each portion of the semiconductor device 10 which portion corresponds to the imaging area of the image recognition camera of the laser trimming apparatus.

The openings 13B and 14C exposing the first patterns $20_{x1}$ through $20_{x4}$ and the second patterns $20_{y1}$ through $20_{y4}$ may be formed at the same time when the openings 13A and 14A are formed to expose the bonding pads 33.

In the first embodiment, as described above, the alignment pattern 20 includes the first patterns $20_{x1}$ through $20_{x4}$ and the second patterns $20_{y1}$ through $20_{y4}$ and is formed on the peripheries of the semiconductor integrated circuit forming areas B. With this configuration, even when the width of a scribe area is small, it is possible to form an alignment pattern that can reflect light with an intensity sufficient for a semiconductor manufacturing apparatus (such as a laser trimming apparatus or an exposure apparatus) to precisely detect the position of the alignment pattern.

Also, if the alignment pattern 20 is formed on the peripheries of the semiconductor integrated circuit forming areas B, sawdust of the alignment pattern 20 is not generated when the semiconductor substrate 11 is diced into the semiconductor integrated circuit forming areas B. This in turn improves the yield of the semiconductor integrated circuits 17 after dicing.

Also, using portions of the wiring patterns 38 of the guard rings 18 exposed through the insulating film 13 and the passivation film 14 as the alignment pattern 20 eliminates the need to separately provide an alignment pattern as in the conventional semiconductor devices 100 and 110 and thereby makes it possible to reduce the production cost of the semiconductor device 10.

Further, it is possible to form the alignment pattern 20 without increasing the number of steps for producing the semiconductor device 10 by forming the openings 13B and 14C exposing the portions of the wiring patterns 38 used as the alignment pattern 20 at the same time when the openings 13A and 14A exposing the bonding pads 33 are formed.

Multiple chip alignment patterns (not shown) are provided on the semiconductor substrate 11. The chip alignment pattern is finer than the alignment pattern 20. For example, the chip alignment pattern may have a width of about 100 µm. Normally, the semiconductor device 10 is roughly aligned using the alignment pattern 20 and is then aligned precisely by illuminating the chip alignment pattern with a laser beam and detecting the laser beam reflected from the chip alignment pattern.

Figure 3:
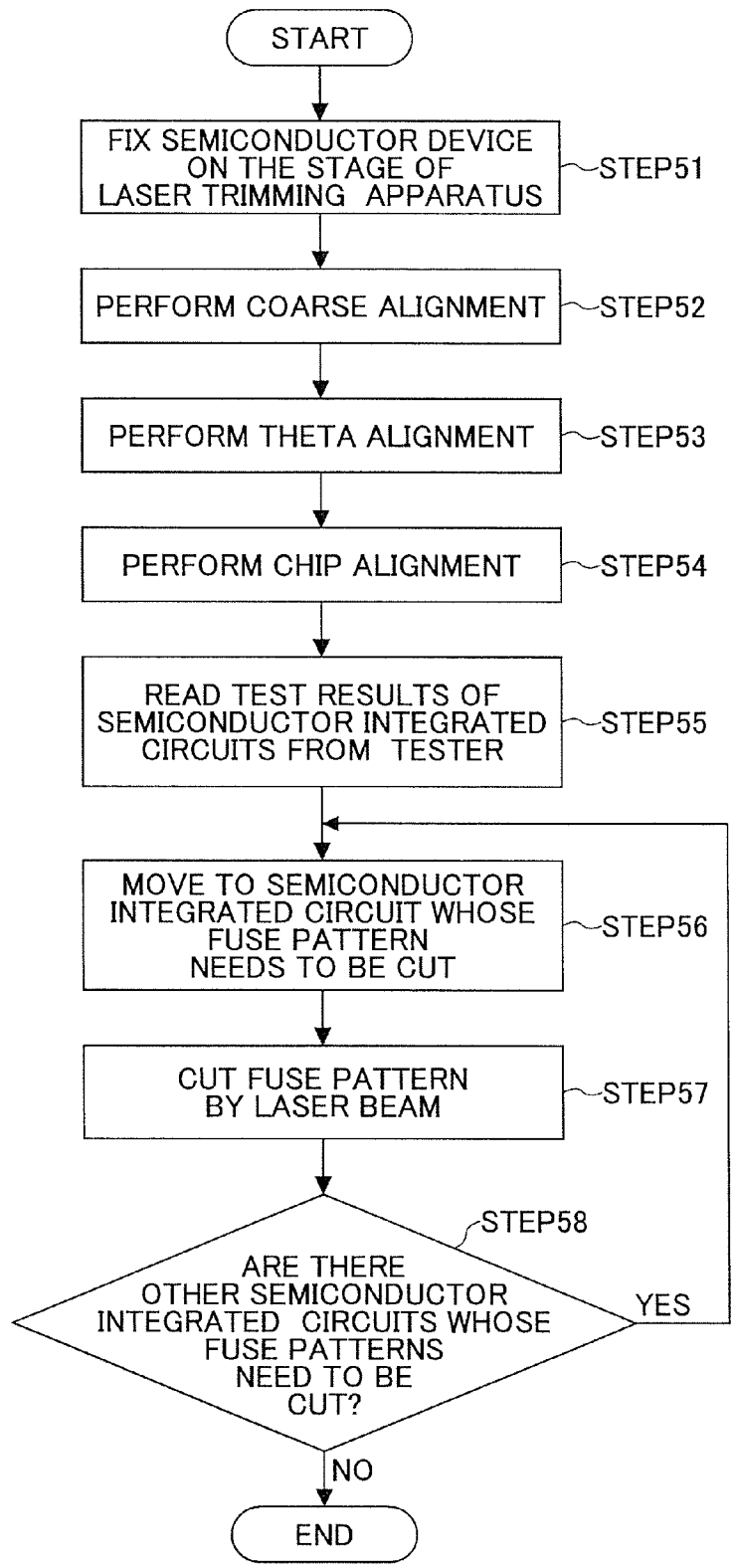
FIG. 3 is a flowchart showing an exemplary method of processing a semiconductor device according to the first embodiment of the present invention.

FIG. 3 is a flowchart showing an exemplary method of processing a semiconductor device according to the first embodiment of the present invention. In the process shown in FIG. 3, it is assumed that electrical tests have been performed on the semiconductor integrated circuits 17 of the semiconductor device 10 using a tester. The test results are used to determine whether to cut the fuse pattern 34 of each of the semiconductor integrated circuits 17 by the laser trimming apparatus.

In step 51 of FIG. 3, the semiconductor device 10 that has been tested by a tester is conveyed into the laser trimming apparatus and fixed on a stage of the laser trimming apparatus. When the semiconductor device 10 is fixed onto the stage, the angle of the semiconductor device 10 is adjusted using an orientation flat and/or the scribe area C formed on the semiconductor substrate 11.

In step 52, coarse alignment is performed using any one of the alignment patterns 20 formed on the semiconductor device 10. In the coarse alignment, the semiconductor device 10 is roughly aligned to determine the position of a trimming area.

In step 53, theta alignment is performed using the alignment pattern 20. In the theta alignment, an angular misalignment of the semiconductor device 10 is corrected. Thus, the alignment pattern 20 is mainly used in steps 52 and 53 for the coarse alignment and the theta alignment. Then, fine alignment is performed. The alignment pattern 20 may also be used for the fine alignment. In the fine alignment, the semiconductor device 10 is aligned to determine the positions of chip alignment patterns.

In step 54, chip alignment is performed using the chip alignment patterns. In the chip alignment, the chip alignment patterns, which are finer than the alignment pattern 20, are illuminated with a laser beam from a laser of the laser trimming apparatus and the peaks of the reflected light are detected to precisely determine the positions of the fuse patterns 34.

In step 55, the test results of the semiconductor integrated circuits 17 are read from the tester. In step 56, the laser trimming apparatus determines, based on the test results, semiconductor integrated circuits 17 whose fuse patterns 34 need to be cut and moves to the fuse pattern 34 of one of the determined semiconductor integrated circuits 17.

Figure 4:
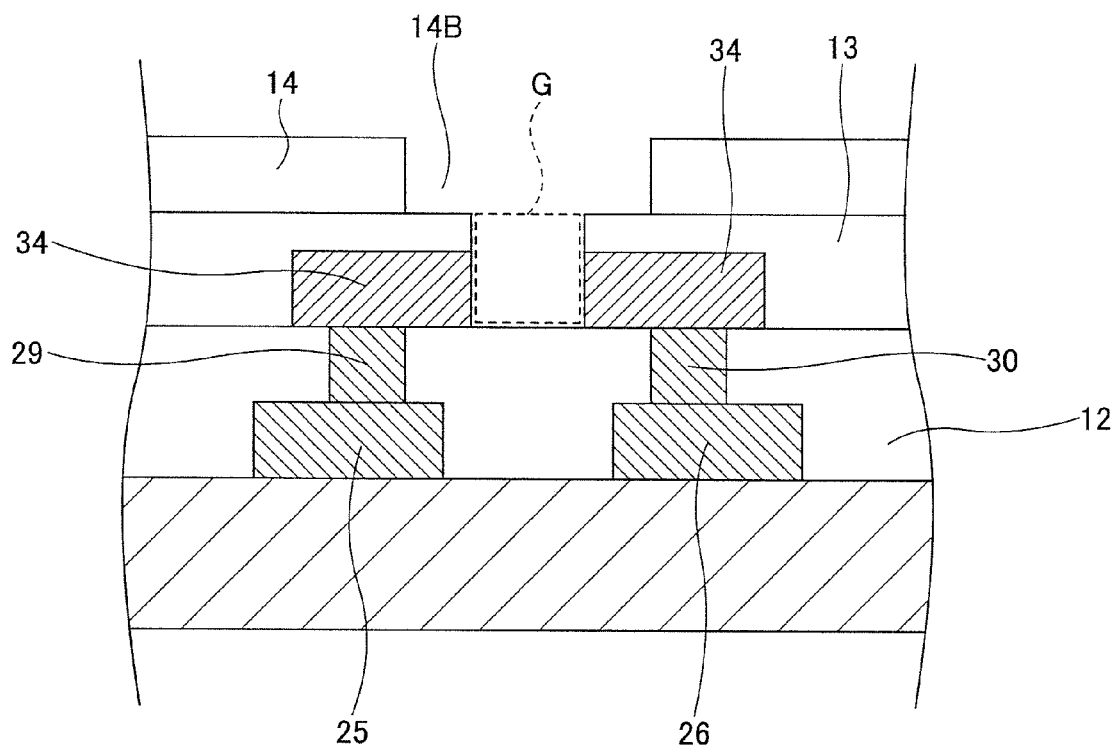
FIG. 4 is a schematic diagram illustrating a fuse pattern cut by a laser beam.

FIG. 4 is a schematic diagram illustrating the fuse pattern 34 cut by a laser beam. In FIG. 4, the same reference numbers are used for the components corresponding to those of the semiconductor device 10 of the first embodiment. In FIG. 4, "G" indicates a portion of the fuse pattern 34 that is cut by a laser beam.

In step 57, as shown in FIG. 4, the fuse pattern 34 is cut by a laser beam (fuse pattern cutting step). As a result, the wiring patterns 25 and 26 are electrically disconnected from each other.

In step 58, the laser trimming apparatus determines whether there are other semiconductor integrated circuits 17 whose fuse patterns 34 need to be cut. If the result of step 58 is Yes, the process returns to step 56. If the result of step 58 is No, the process is terminated.

In the above exemplary method of processing a semiconductor device of this embodiment, the coarse alignment and the theta alignment are performed using the alignment pattern 20 that is formed on the peripheries of the semiconductor integrated circuit forming areas B and that is able to reflect light with an intensity sufficient for a semiconductor manufacturing apparatus (such as a laser trimming apparatus or an exposure apparatus) to precisely detect the position of the alignment pattern 20. Accordingly, this method makes it possible to accurately align the semiconductor device 10.

Precise detection of the position of the alignment pattern 20 in turn improves the accuracy of detecting the position of the fuse pattern 34 and thereby makes it possible to accurately cut the fuse pattern 34 even when the width of the fuse pattern 34 is small.

In the above embodiment, a laser trimming apparatus is used as an example of a semiconductor manufacturing apparatus to describe a method of processing a semiconductor device. However, the above embodiment may be applied to other semiconductor manufacturing apparatuses such as an exposure apparatus.

The semiconductor integrated circuit forming areas B-1 through B-4, where the alignment pattern 20 is formed, may be chosen freely from the semiconductor integrated circuit forming areas B in each portion of the semiconductor device 10 which portion corresponds to the imaging area of the image recognition camera of the laser trimming apparatus.

Second Embodiment

Figure 5:
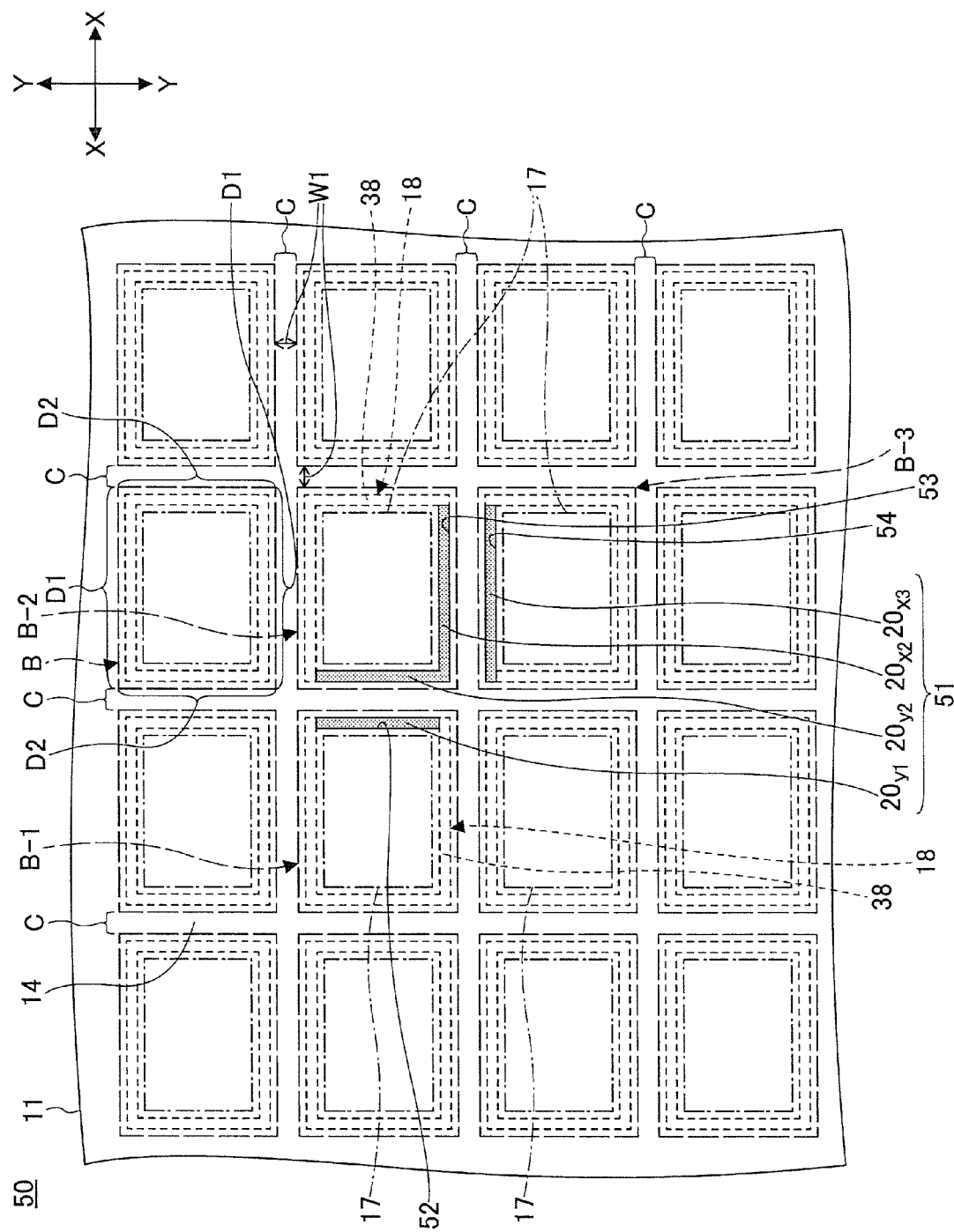
FIG. 5 is a plan view of a semiconductor device according to a second embodiment of the present invention.

FIG. 5 is a plan view of a portion of a semiconductor device 50 according to a second embodiment of the present invention. The portion corresponds to the imaging area of an image recognition camera of a laser trimming apparatus (not shown). In FIG. 5, the same reference numbers are used for the components corresponding to those of the semiconductor device 10 of the first embodiment shown in FIG. 2.

As shown in FIG. 5, the semiconductor device 50 includes an alignment pattern 51 instead of the alignment pattern 20 of the semiconductor device 10 of the first embodiment. Other components of the semiconductor device 50 are substantially the same as those of the semiconductor device 10.

The alignment pattern 51 includes first patterns $20_{x2}$ and $20_{x3}$ and second patterns $20_{y1}$ and $20_{y2}$. In other words, the alignment pattern 51 has a structure similar to that of the alignment pattern 20 except that the first patterns $20_{x1}$ and $20_{x4}$ and the second patterns $20_{y3}$ and $20_{y4}$ of the alignment pattern 20 are not present in the alignment pattern 51.

The second pattern $20_{y1}$ of the alignment pattern 51 is exposed through an opening 52 in the insulating film 13 and the passivation film 14. The first pattern $20_{x2}$ and the second pattern $20_{y2}$ of the alignment pattern 51 are exposed through an opening 53 in the insulating film 13 and the passivation film 14. The first pattern $20_{x3}$ of the alignment pattern 51 is exposed through an opening 54 in the insulating film 13 and the passivation film 14. The alignment pattern 51 is formed on three semiconductor integrated circuit forming areas B-1 through B-3.

The semiconductor device 50 of the second embodiment including the alignment pattern 51 has advantageous effects similar to those of the semiconductor device 10 of the first embodiment.

The semiconductor device 50 may be substituted for the semiconductor device 10 in the exemplary processing method of the first embodiment shown in FIG. 3. In the exemplary processing method, the semiconductor device 50 provides advantageous effects similar to those of the semiconductor device 10.

The semiconductor integrated circuit forming areas B-1 through B-3, where the alignment pattern 51 is formed, may be chosen freely from the semiconductor integrated circuit forming areas B in each portion of the semiconductor device 50 which portion corresponds to the imaging area of the image recognition camera of the laser trimming apparatus.

Third Embodiment

Figure 6:
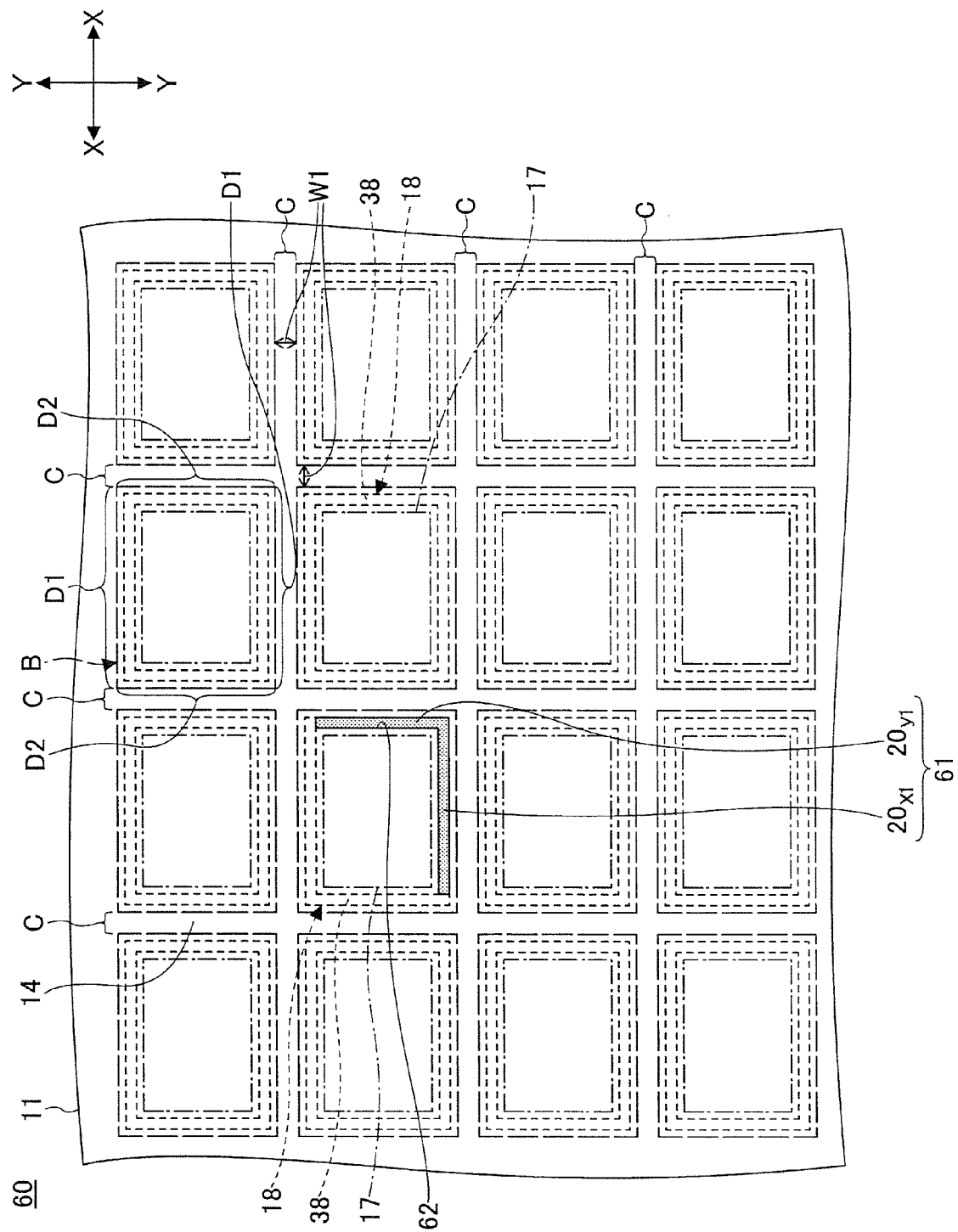
FIG. 6 is a plan view of a semiconductor device according to a third embodiment of the present invention.

FIG. 6 is a plan view of a portion of a semiconductor device 60 according to a third embodiment of the present invention. The portion corresponds to the imaging area of an image recognition camera of a laser trimming apparatus (not shown). In FIG. 6, the same reference numbers are used for the components corresponding to those of the semiconductor device 10 of the first embodiment shown in FIG. 2.

As shown in FIG. 6, the semiconductor device 60 includes an alignment pattern 61 instead of the alignment pattern 20 of the semiconductor device 10 of the first embodiment. Other components of the semiconductor device 60 are substantially the same as those of the semiconductor device 10.

The alignment pattern 61 includes a first pattern $20_{x1}$ and a second pattern $20_{y1}$. In other words, the alignment pattern 61 has a structure similar to that of the alignment pattern 20 except that the first patterns $20_{x2}$, $20_{x3}$, and $20_{x4}$ and the second patterns $20_{y2}$, $20_{y3}$ and $20_{y4}$ of the alignment pattern 20 are not present in the alignment pattern 61. The first pattern $20_{x1}$ and the second pattern $20_{y1}$ of the alignment pattern 61 are formed on one of the semiconductor integrated circuit forming areas B in each portion of the semiconductor device 60 which portion corresponds to the imaging area of the image recognition camera of the laser trimming apparatus. The first pattern $20_{x1}$ and the second pattern $20_{y1}$ are exposed through an opening 62 in the insulating film 13 and the passivation film 14.

The semiconductor device 60 of the third embodiment including the alignment pattern 61 has advantageous effects similar to those of the semiconductor device 10 of the first embodiment.

The semiconductor device 60 may be substituted for the semiconductor device 10 in the exemplary processing method of the first embodiment shown in FIG. 3. In the exemplary processing method, the semiconductor device 60 provides advantageous effects similar to those of the semiconductor device 10.

The semiconductor integrated circuit forming area B where the alignment pattern 61 is formed may be chosen freely from the semiconductor integrated circuit forming areas B in each portion of the semiconductor device 60 which portion corresponds to the imaging area of the image recognition camera of the laser trimming apparatus.

Fourth Embodiment

Figure 7:
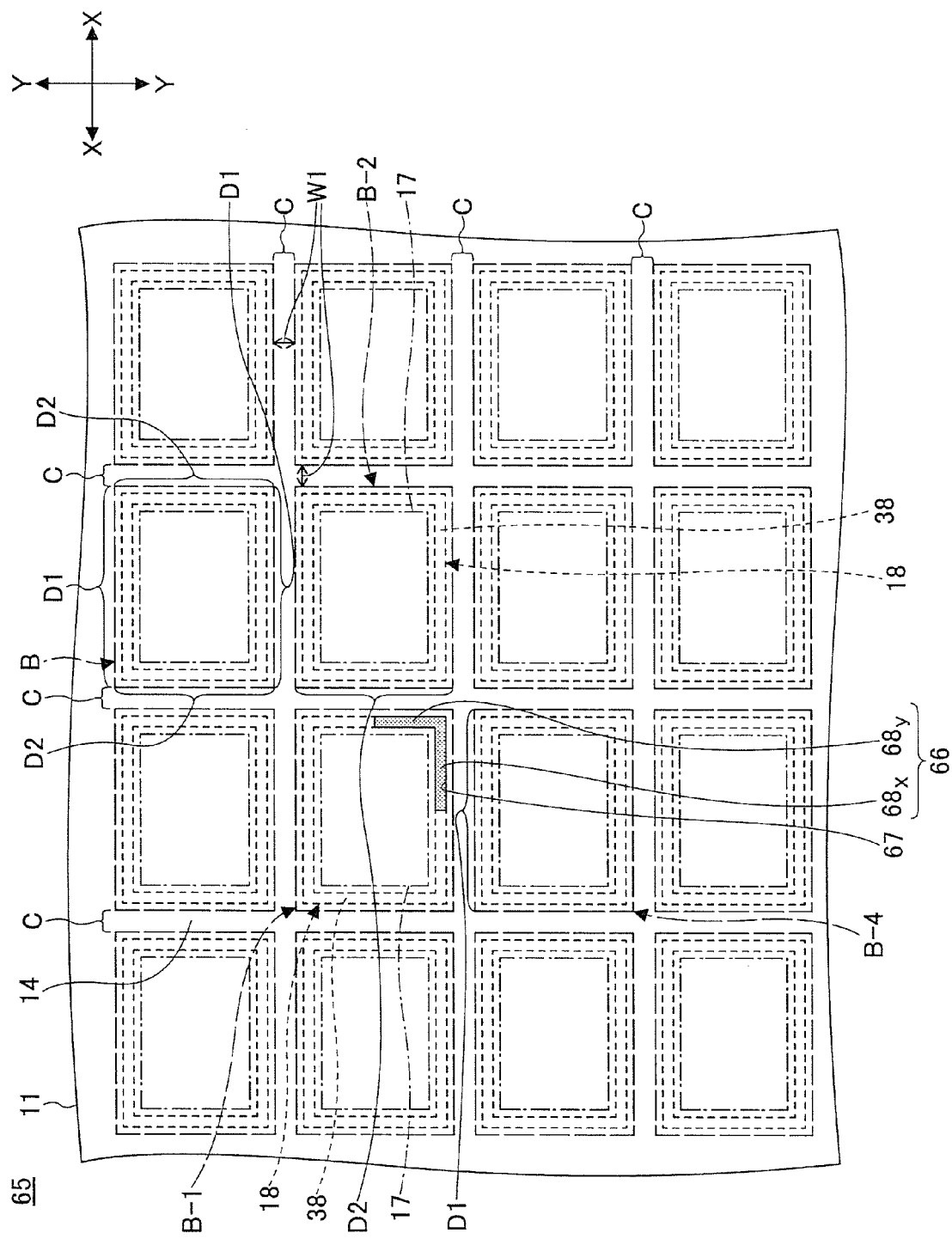
FIG. 7 is a plan view of a semiconductor device according to a fourth embodiment of the present invention.

FIG. 7 is a plan view of a portion of a semiconductor device 65 according to a fourth embodiment of the present invention. The portion corresponds to the imaging area of an image recognition camera of a laser trimming apparatus (not shown). In FIG. 7, the same reference numbers are used for the components corresponding to those of the semiconductor device 10 of the first embodiment shown in FIG. 2.

As shown in FIG. 7, the semiconductor device 65 includes an alignment pattern 66 instead of the alignment pattern 20 of the semiconductor device 10 of the first embodiment. Other components of the semiconductor device 65 are substantially the same as those of the semiconductor device 10. The alignment pattern 66 is formed on the periphery of the semiconductor integrated circuit forming area B-1 in each portion of the semiconductor device 65 which portion corresponds to the imaging area of the image recognition camera of the laser trimming apparatus. The alignment pattern 66 includes a first pattern $68_x$ and a second pattern $68_y$.

The first pattern $68_x$ is shaped like a strip that is substantially parallel to the side D1 of the semiconductor integrated circuit forming area B-1. The first pattern $68_x$ is composed of a portion of the wiring pattern 38 (of the guard ring 18) formed on the semiconductor integrated circuit forming area B-1 which portion faces the side D1 of the semiconductor integrated circuit forming area B-4 and is exposed through the insulating film 13 and the passivation film 14. The first pattern $68_x$ and the second pattern $68_y$ are formed as a single unit.

The second pattern $68_y$ is shaped like a strip that is substantially parallel to the side D2 of the semiconductor integrated circuit forming area B-1 and that is substantially orthogonal to the first pattern $68_x$. The second pattern $68_y$ is composed of a portion of the wiring pattern 38 (of the guard ring 18) formed on the semiconductor integrated circuit forming area B-1 which portion faces the side D2 of the semiconductor integrated circuit forming area B-2 and is exposed through the insulating film 13 and the passivation film 14.

The first pattern $68_x$ and the second pattern $68_y$ are exposed through an L-shaped opening 67 in the insulating film 13 and the passivation film 14. The first pattern $68_x$ and the second pattern $68_y$ configured as described above can reflect light to the image recognition camera of the laser trimming apparatus placed above the semiconductor device 65.

The semiconductor device 65 of the fourth embodiment including the alignment pattern 66 has advantageous effects similar to those of the semiconductor device 10 of the first embodiment.

The semiconductor device 65 may be substituted for the semiconductor device 10 in the exemplary processing method of the first embodiment shown in FIG. 3. In the exemplary processing method, the semiconductor device 65 provides advantageous effects similar to those of the semiconductor device 10.

The semiconductor integrated circuit forming area B-1 where the alignment pattern 66 is formed may be chosen freely from the semiconductor integrated circuit forming areas B in each portion of the semiconductor device 65 which portion corresponds to the imaging area of the image recognition camera of the laser trimming apparatus.

Fifth Embodiment

Figure 8:
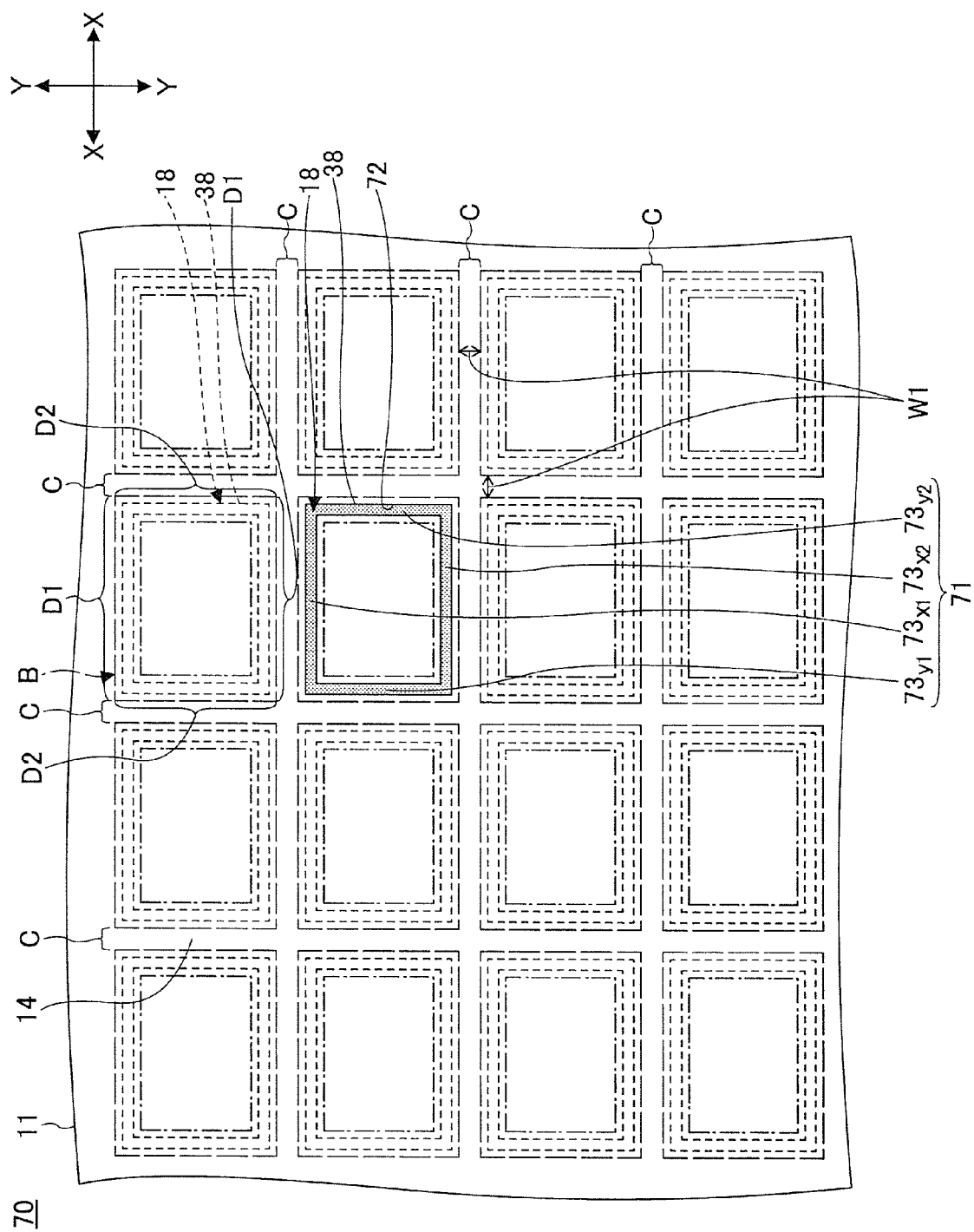
FIG. 8 is a plan view of a semiconductor device according to a fifth embodiment of the present invention.

FIG. 8 is a plan view of a portion of a semiconductor device 70 according to a fifth embodiment of the present invention. The portion corresponds to the imaging area of an image recognition camera of a laser trimming apparatus (not shown). In FIG. 8, the same reference numbers are used for the components corresponding to those of the semiconductor device 10 of the first embodiment shown in FIG. 2.

As shown in FIG. 8, the semiconductor device 70 includes an alignment pattern 71 instead of the alignment pattern 20 of the semiconductor device 10 of the first embodiment. Other components of the semiconductor device 70 are substantially the same as those of the semiconductor device 10.

The alignment pattern 71 is formed on the periphery of one of the semiconductor integrated circuit forming areas B in each portion of the semiconductor device 70 which portion corresponds to the imaging area of the image recognition camera of the laser trimming apparatus. The alignment pattern 71 includes first patterns $73_{x1}$ and $73_{x2}$ and second patterns $73_{y1}$ and $73_{y2}$.

The first patterns $73_{x1}$ and $73_{x2}$ are shaped like strips that are substantially parallel to the sides D1 of the semiconductor integrated circuit forming area B. Each of the first patterns $73_{x1}$ and $73_{x2}$ is composed of a portion of the wiring pattern 38 (of the guard ring 18) formed on the semiconductor integrated circuit forming area B which portion is substantially parallel to the side D1 of the semiconductor integrated circuit forming area B and is exposed through the insulating film 13 and the passivation film 14.

The second patterns $73_{y1}$ and $73_{y2}$ are shaped like strips that are substantially parallel to the sides D2 of the semiconductor integrated circuit forming area B. The second patterns $73_{y1}$ and $73_{y2}$ form substantially right angles with the first patterns $73_{x1}$ and $73_{x2}$. The first patterns $73_{x1}$ and $73_{x2}$ and the second patterns $73_{y1}$ and $73_{y2}$ are formed as a single unit. Each of the second patterns $73_{y1}$ and $73_{y2}$ is composed of a portion of the wiring pattern 38 (of the guard ring 18) formed on the semiconductor integrated circuit forming area B which portion is substantially parallel to the side D2 of the semiconductor integrated circuit forming area B and is exposed through the insulating film 13 and the passivation film 14. In other words, the first patterns $73_{x1\,1\,and\,73x2}$ and the second patterns $73_{y1}$ and $73_{y2}$ are formed on the periphery of the same semiconductor integrated circuit forming area B.

The upper surfaces of the first patterns $73_{x1}$ and $73_{x2}$ and the second patterns $73_{y1}$ and $73_{y2}$ are exposed through an opening 72 in the insulating film 13 and the passivation film 14. The opening 72 is shaped like a frame.

The semiconductor device 70 of the fifth embodiment including the alignment pattern 71 has advantageous effects similar to those of the semiconductor device 10 of the first embodiment.

The semiconductor device 70 may be substituted for the semiconductor device 10 in the exemplary processing method of the first embodiment shown in FIG. 3. In the exemplary processing method, the semiconductor device 70 provides advantageous effects similar to those of the semiconductor device 10.

The semiconductor integrated circuit forming area B where the alignment pattern 71 is formed may be chosen freely from the semiconductor integrated circuit forming areas B in each portion of the semiconductor device 70 which portion corresponds to the imaging area of the image recognition camera of the laser trimming apparatus.

Sixth Embodiment

Figure 9:
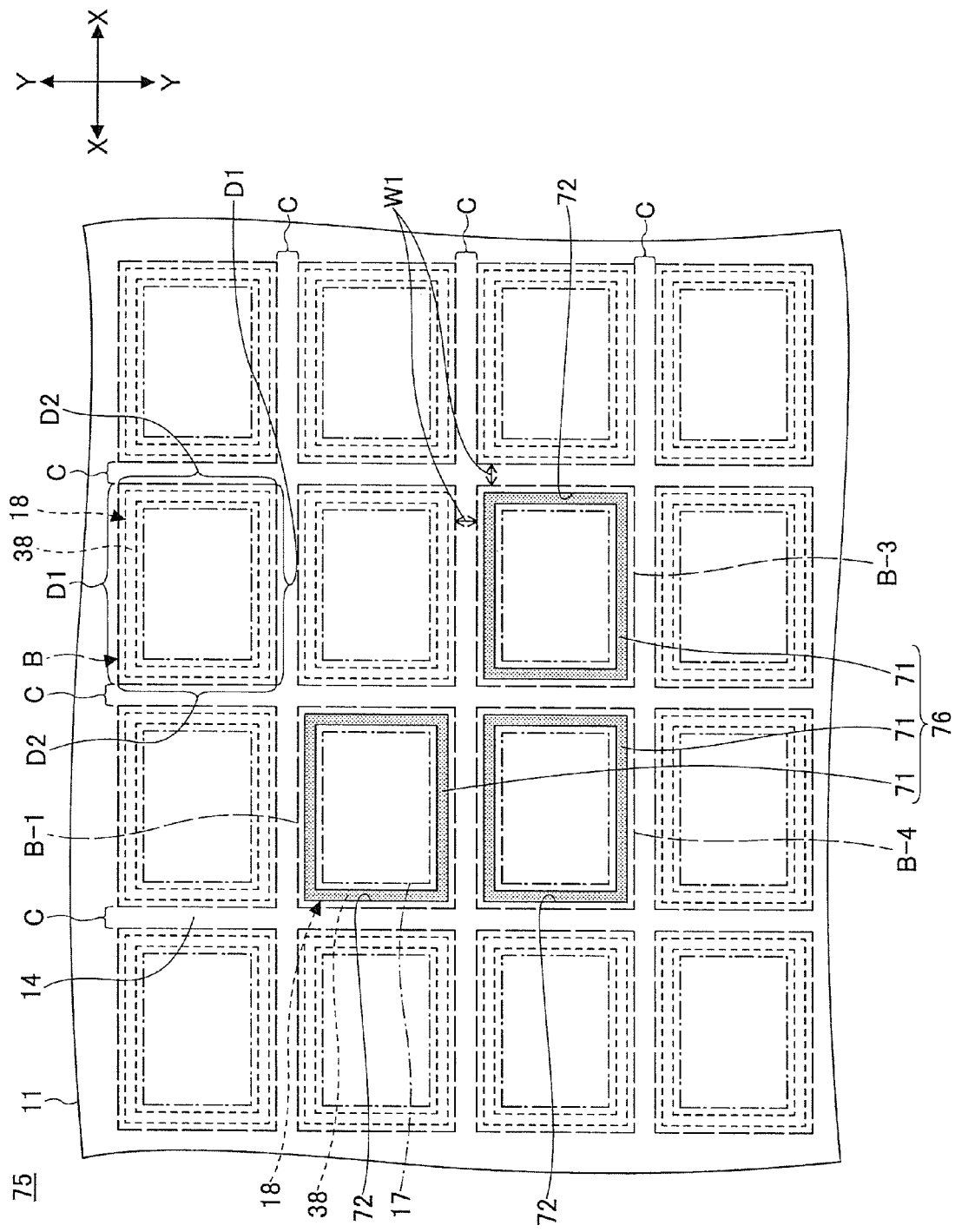
FIG. 9 is a plan view of a semiconductor device according to a sixth embodiment of the present invention.

FIG. 9 is a plan view of a portion of a semiconductor device 75 according to a sixth embodiment of the present invention. The portion corresponds to an imaging area of an image recognition camera of a laser trimming apparatus (not shown). In FIG. 9, the same reference numbers are used for the components corresponding to those of the semiconductor device 10 of the first embodiment shown in FIG. 2.

As shown in FIG. 9, the semiconductor device 75 includes an alignment pattern 76 instead of the alignment pattern 20 of the semiconductor device 10 of the first embodiment. Other components of the semiconductor device 75 are substantially the same as those of the semiconductor device 10.

The alignment pattern 76 includes three alignment patterns 71 of the fifth embodiment. The alignment patterns 71 are formed, respectively, on three semiconductor integrated circuit forming areas B-1, B-3, and B-4 that are arranged in the shape of "L".

The semiconductor device 75 of the sixth embodiment including the alignment pattern 76 has advantageous effects similar to those of the semiconductor device 10 of the first embodiment.

The semiconductor device 75 may be substituted for the semiconductor device 10 in the exemplary processing method of the first embodiment shown in FIG. 3. In the exemplary processing method, the semiconductor device 75 provides advantageous effects similar to those of the semiconductor device 10.

The semiconductor integrated circuit forming areas B-1, B-3, and B-4, where the alignment pattern 76 is formed, may be chosen freely from the semiconductor integrated circuit forming areas B in each portion of the semiconductor device 75 which portion corresponds to the imaging area of the image recognition camera of the laser trimming apparatus.

Seventh Embodiment

Figure 10:
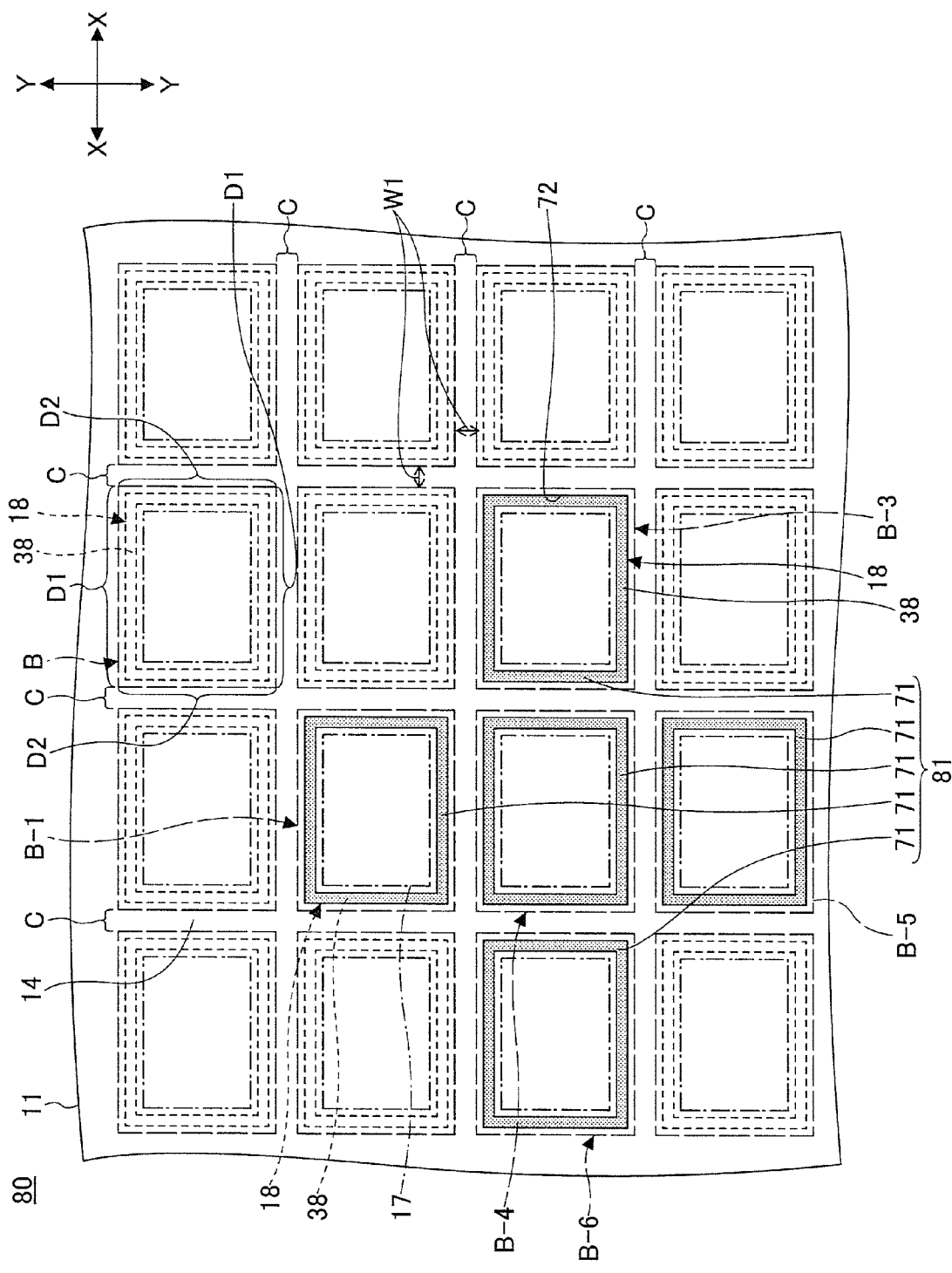
FIG. 10 is a plan view of a semiconductor device according to a seventh embodiment of the present invention.
Figure 11:
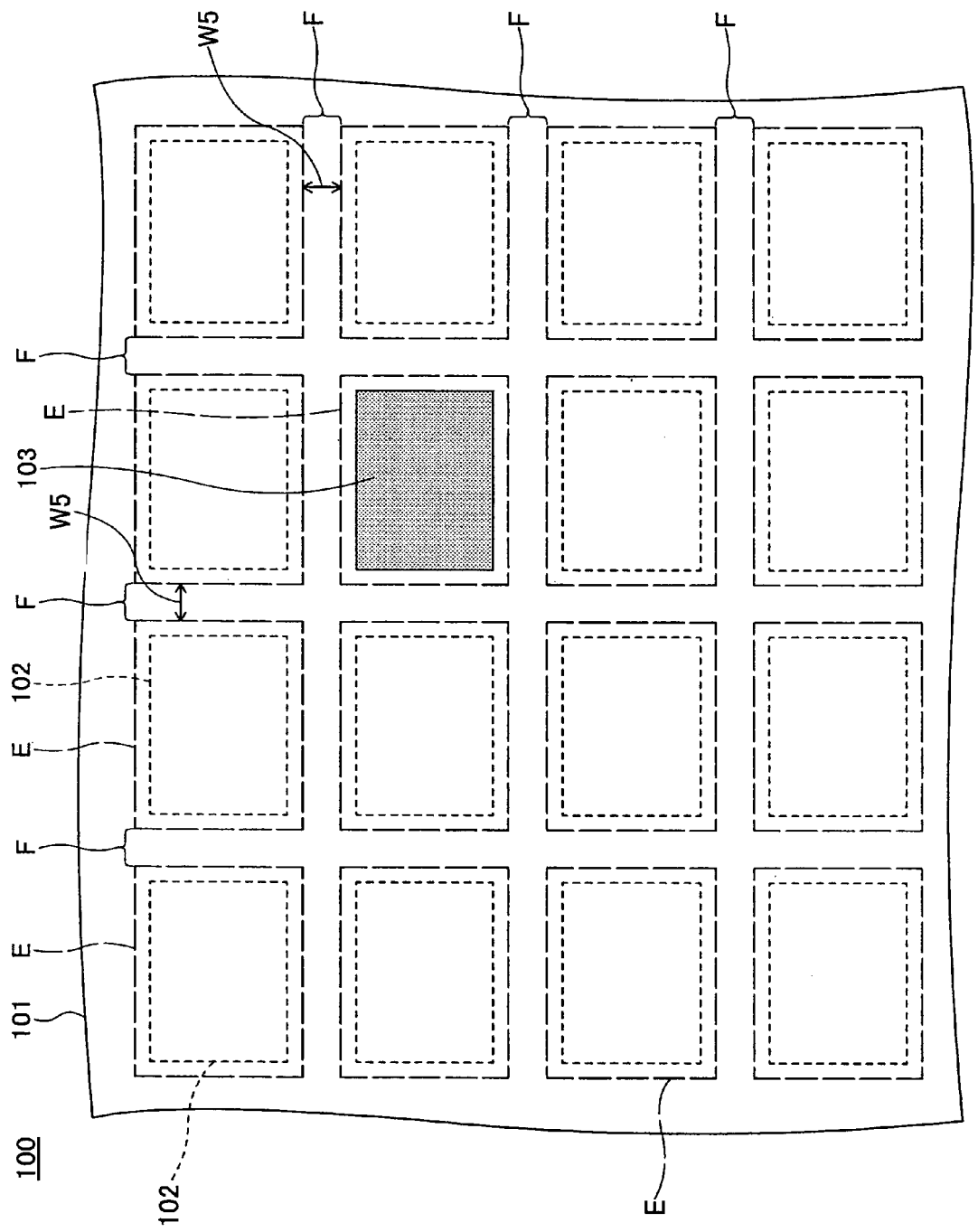
FIG. 11 is a plan view of a conventional semiconductor device.
Figure 12:
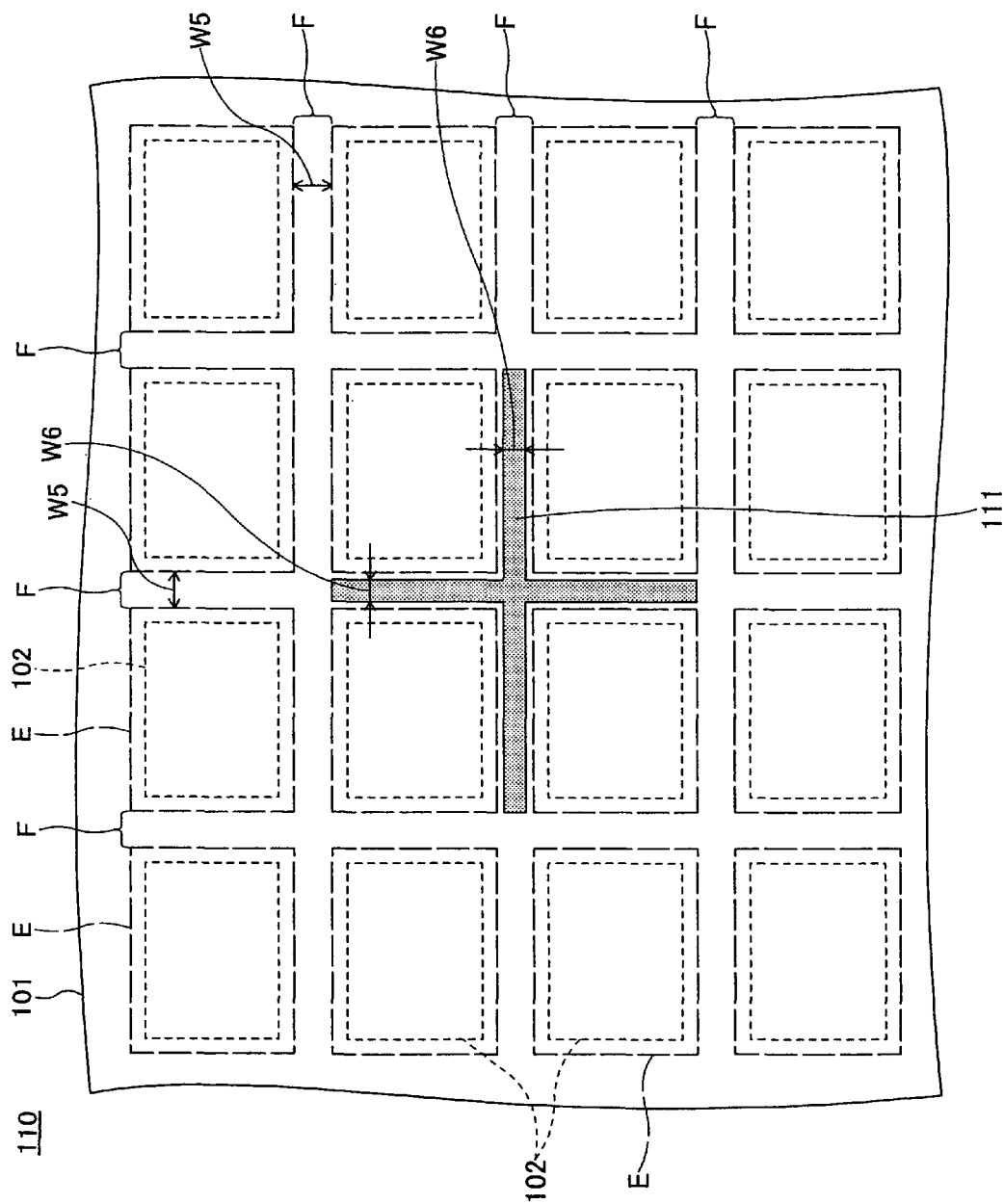
FIG. 12 is a plan view of another conventional semiconductor device.

FIG. 10 is a plan view of a portion of a semiconductor device 80 according to a seventh embodiment of the present invention. The portion corresponds to an imaging area of an image recognition camera of a laser trimming apparatus (not shown). In FIG. 10, the same reference numbers are used for the components corresponding to those of the semiconductor device 10 of the first embodiment shown in FIG. 2.

As shown in FIG. 10, the semiconductor device 80 includes an alignment pattern 81 instead of the alignment pattern 20 of the semiconductor device 10 of the first embodiment. Other components of the semiconductor device 80 are substantially the same as those of the semiconductor device 10.

The alignment pattern 81 includes five alignment patterns 71 of the fifth embodiment. The alignment patterns 71 are formed, respectively, on the peripheries of five semiconductor integrated circuit forming areas B-1, B-3, B-4, B-5, and B-6 that are arranged in the shape of a cross. The semiconductor integrated circuit forming areas B-1 and B-5 are situated next to the semiconductor integrated circuit forming area B-4 in the Y-Y directions. The semiconductor integrated circuit forming areas B-3 and B-6 are situated next to the semiconductor integrated circuit forming area B-4 in the X-X directions.

The semiconductor device 80 of the seventh embodiment including the alignment pattern 81 has advantageous effects similar to those of the semiconductor device 10 of the first embodiment.

The semiconductor device 80 may be substituted for the semiconductor device 10 in the exemplary processing method of the first embodiment shown in FIG. 3. In the exemplary processing method, the semiconductor device 80 provides advantageous effects similar to those of the semiconductor device 10.

The semiconductor integrated circuit forming areas B-1, B-3, B-4, B-5, and B-6, where the alignment pattern 81 is formed, may be chosen freely from the semiconductor integrated circuit forming areas B in each portion of the semiconductor device 80 which portion corresponds to the imaging area of the image recognition camera of the laser trimming apparatus.

As described above, embodiments of the present invention make it possible to precisely detect the position of an alignment pattern.

Embodiments of the present invention provide a semiconductor device including an alignment pattern and a method of processing the semiconductor device.

According to an embodiment of the present invention, an alignment pattern is formed on the peripheries of semiconductor integrated circuit forming areas of a semiconductor substrate. With this configuration, even when the width of a scribe area is small, it is possible to form an alignment pattern that can reflect light with an intensity sufficient for a semiconductor manufacturing apparatus (such as a laser trimming apparatus or an exposure apparatus) to precisely detect the position of the alignment pattern.

In a method according to an embodiment of the present invention, alignment is performed using an alignment pattern formed on the peripheries of semiconductor integrated circuit forming areas which alignment pattern can reflect light with an intensity sufficient for a semiconductor manufacturing apparatus to precisely detect the position of the alignment pattern. Accordingly, this method makes it possible to accurately align a semiconductor device.

Precise detection of the position of an alignment pattern in turn improves the accuracy of detecting the position of a fuse pattern and thereby makes it possible to accurately cut the fuse pattern even when the width of the fuse pattern is small.

The present invention is not limited to the specifically disclosed embodiments, and variations and modifications may be made without departing from the scope of the present invention.

The present application is based on Japanese Priority Application No. 2006-240324, filed on Sep. 5, 2006, the entire contents of which are hereby incorporated herein by reference.

What is claimed is:

1. A semiconductor device, comprising:
   a semiconductor substrate including semiconductor integrated circuit forming areas;
   semiconductor integrated circuits formed on the semiconductor integrated circuit forming areas; and
   an alignment pattern formed on a periphery of at least one of the semiconductor integrated circuit forming areas,
   wherein the alignment pattern is implemented by a guard ring formed on the periphery of at least one of the semiconductor integrated circuit forming areas and exposed through a passivation film covering the guard ring.

2. The semiconductor device as claimed in claim 1, wherein
   each of the semiconductor integrated circuit forming areas is shaped like a quadrangle having first sides and second sides;
   the alignment pattern includes a first pattern that is substantially parallel to the first sides and a second pattern that is substantially parallel to the second sides; and
   the first pattern and the second pattern are substantially orthogonal to each other.

3. The semiconductor device as claimed in claim 2, wherein
   the alignment pattern is formed on the peripheries of two or more of the semiconductor integrated circuit forming areas; and
   the first pattern and the second pattern are formed on different ones of the two or more of the semiconductor integrated circuit forming areas.

4. The semiconductor device as claimed in claim 2, wherein
   the alignment pattern is formed on the peripheries of two or more of the semiconductor integrated circuit forming areas; and
   the first pattern and the second pattern are formed on each of the two or more of the semiconductor integrated circuit forming areas.

5. The semiconductor device as claimed in claim 1, wherein the alignment pattern is to be used by a laser trimming apparatus to align the semiconductor device.

6. A method of processing a semiconductor device comprising a semiconductor substrate including semiconductor integrated circuit forming areas and semiconductor integrated circuits formed on the semiconductor integrated circuit forming areas, each of the semiconductor integrated circuits including a fuse pattern for adjusting an electrical characteristic thereof, said method comprising:
   an alignment step of aligning the semiconductor device by a laser trimming apparatus based on an alignment pattern formed on a periphery of at least one of the semiconductor integrated circuit forming areas; and
   a fuse pattern cutting step of cutting, by the laser trimming apparatus, the fuse pattern of at least one of the semiconductor integrated circuits whose electrical characteristic needs to be adjusted,
   wherein the alignment pattern is implemented by a guard ring formed on the periphery of at least one of the semiconductor integrated circuit forming areas and exposed through a passivation film covering the guard ring.

* * * * *